United States Patent [19]
Li et al.

[11] Patent Number: 5,960,024
[45] Date of Patent: Sep. 28, 1999

[54] VERTICAL OPTICAL CAVITIES PRODUCED WITH SELECTIVE AREA EPITAXY

[75] Inventors: Gabriel S. Li, Daly City; Wupen Yuen, Stanford; Constance J. Chang-Hasnain, Union City, all of Calif.

[73] Assignee: Bandwidth Unlimited, Inc., Union City, Calif.

[21] Appl. No.: 09/050,657

[22] Filed: Mar. 30, 1998

[51] Int. Cl.[6] .................................................. H01S 3/19
[52] U.S. Cl. .................. 372/96; 372/46; 372/45
[58] Field of Search ................................ 372/96, 46, 45, 372/50

[56] References Cited

U.S. PATENT DOCUMENTS

| | | | |
|---|---|---|---|
| 5,418,183 | 5/1995 | Joyner et al. | 437/129 |
| 5,446,752 | 8/1995 | Ackley et al. | 372/46 |
| 5,614,436 | 3/1997 | Shim et al. | 437/129 |
| 5,659,640 | 8/1997 | Joyner | 385/14 |
| 5,677,924 | 10/1997 | Bestwick | 372/46 |
| 5,812,577 | 9/1998 | Dawson et al. | 372/46 |

*Primary Examiner*—Rodney Bovernick
*Assistant Examiner*—Yisun Song
*Attorney, Agent, or Firm*—Lumen Intellectual Property Services

[57] ABSTRACT

A monolithic vertical optical cavity device built up along a vertical direction. The device has a bottom Distributed Bragg Reflector (DBR), a Quantum Well (QW) region consisting of least one active layer grown on top of the bottom DBR by using a Selective Area Epitaxy (SAE) mask such that the active layer or layers exhibit a variation in at least one physical parameter in a horizontal plane perpendicular to the vertical direction and a top DBR deposited on top of the QW region. A spacer is deposited with or without SAE adjacent the QW region. The device has a variable Fabry-Perot distance defined along the vertical direction between the bottom DBR and the top DBR and a variable physical parameter of the active layer. The varying physical parameter of the active layers is either their surface curvature and/or the band gap and both of these parameters are regulated by SAE. The monolithic vertical cavity device can be used as a Vertical Cavity Surface Emitting Laser (VCSEL) or a Vertical Cavity Detector (VCDET).

25 Claims, 7 Drawing Sheets

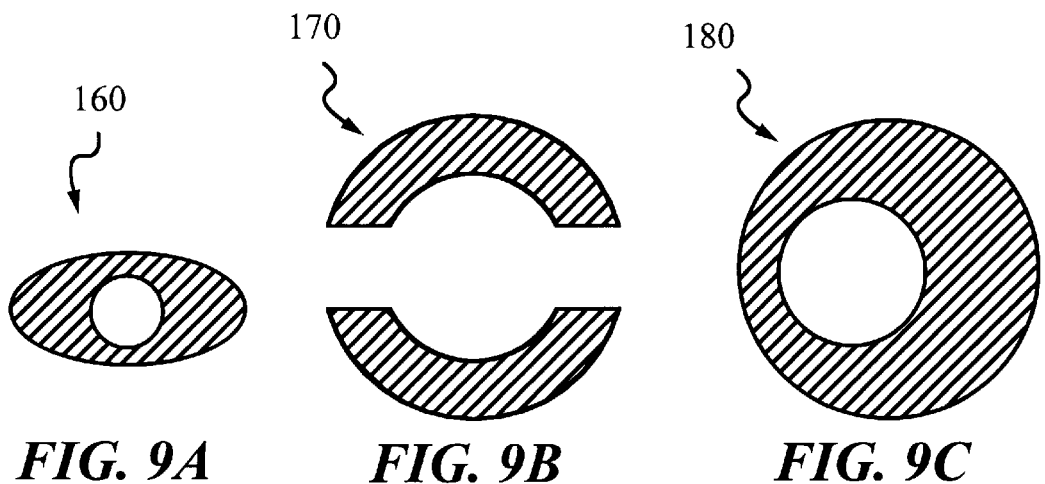
FIG. 9A   FIG. 9B   FIG. 9C
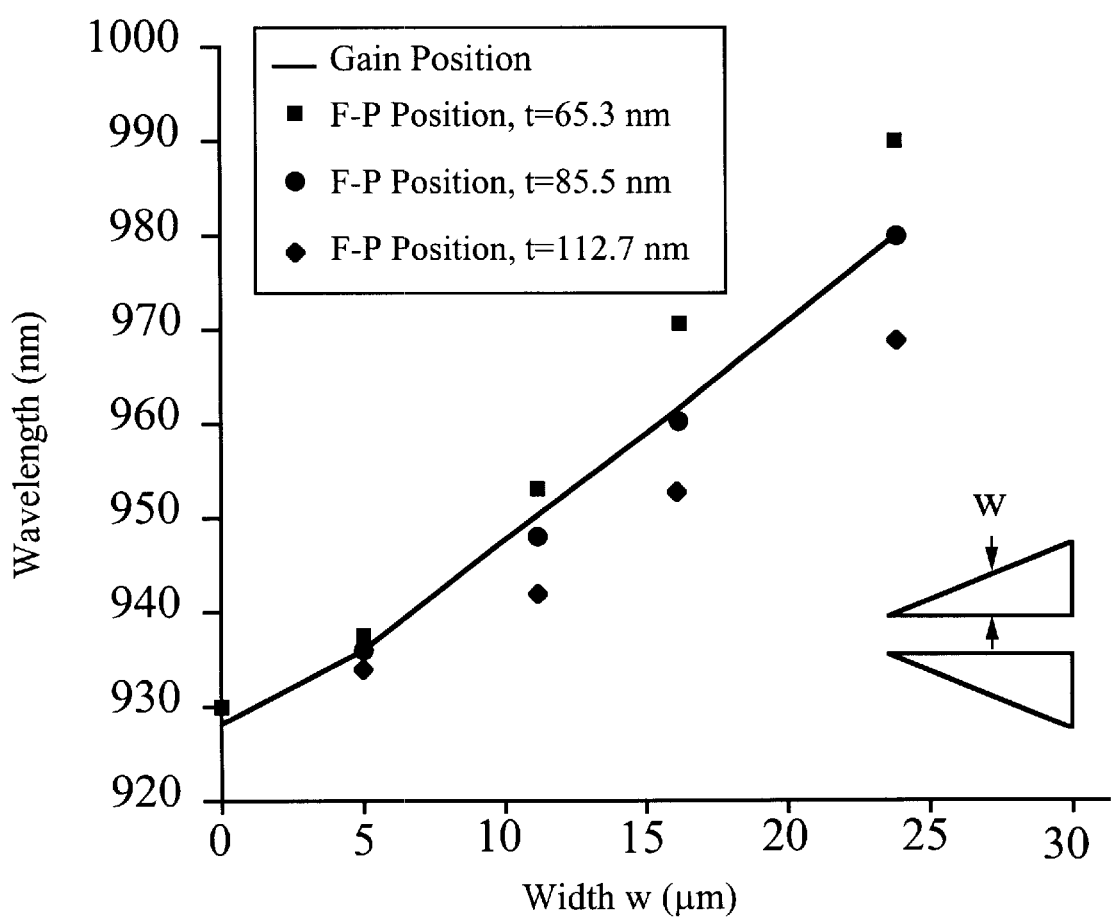
FIG. 10

VERTICAL OPTICAL CAVITIES PRODUCED WITH SELECTIVE AREA EPITAXY

FIELD OF THE INVENTION

This invention relates generally to vertical optical cavity structures such as vertical cavity surface emitting lasers (VCSELs) and detectors (VCDETs) grown with the aid of Selective Area Epitaxy (SAE), and especially to arrays of such structures.

BACKGROUND

When metal-organic chemical vapor deposition (MOCVD) is used as the epitaxy technique to grow an epitaxial layer (e.g., InGaAs) on a substrate with patterned windows of silicon dioxide or silicon nitride, the local growth rate on the substrate is enhanced. This is generally referred to as Selective Area Epitaxy (SAE). The reason for the enhancement is due to the fact that growth on top of the oxide or nitride region is inhibited. Thus, the extra material (e.g., tri-ethyl-Gallium and tri-methyl-Indium) migrate towards the uncovered region, enhancing the local growth rate. The enhancement factor depends on the ratio of oxide (nitride) area to the available growth area and the diffusion coefficient of the metal-organic sources.

Previous applications of SAE have all been towards edge emitting lasers and integrated optoelectronic devices. For example, in U.S. Pat. No. 5,659,640 issued to Joyner the inventor teaches the use of SAE for making an integrated waveguide with an optical grating. Suitable mask geometry is chosen to ensure that the deposition process produces the desired optical structure, i.e., an optical grating or even a stack of Quantum Well regions (QWs). In U.S. Pat. No. 5,418,183 Joyner et al. teach the use of SAE for producing a reflective digitally tunable laser. Another type of multiple QW distributed feedback semiconductor laser grown with the aid of SAE is taught by Shim et al. in U.S. Pat. No. 5,614,436. Additional references illustrating the use of SAE for simultaneously growing optical devices in the same plane are found in the articles of Joyner et al., "Extremely Large Band Gap Shifts for MQW Structures by Selective Epitaxy on $SiO_2$ Masked Substrates," IEEE Phot. Tech. Lett., Vol. 4, No. 9 (September 1992), pp. 1006–9 and Caneau et al., "Selective Organometallic Vapor Phase Epitaxy of Ga and In Compounds: A Comparison of TMIn and TEGa versus TMIn and TMGa," J. Crystal Growth, Vol. 132 (1993), pp. 364–370.

These and similar prior art devices typically have InGaAs QWs in their active region. These QWs are regrown on a patterned substrate with different openings between two oxide strips. The thickness of the QW is inversely proportional to the oxide strip opening due to SAE. Moreover, since the SAE enhancement factor for In is more than the Ga enhancement factor, the In content of the QW is also a function of the oxide strip opening. Hence, the emission wavelength of each laser in the array can be tailored by the oxide strip opening.

The optical elements of the prior art devices are all located in the plane in which SAE is performed. In other words, SAE is performed on a surface which provides for planar alignment between the optical elements. Hence, the resulting devices are limited to a planar element distribution as encountered, e.g., in edge emitting lasers.

OBJECTS AND ADVANTAGES

It is a primary object of the present invention to apply the technique of Selective Area Epitaxy (SAE) to vertical optical cavities. In particular, it is an object of the invention to provide vertical cavity surface emitting lasers (VCSEL) and Vertical Cavity Detectors (VCDET) with varying emission and absorption wavelengths by using SAE.

It is a further object of the invention to provide for simple adjustment of the band gap of Quantum Well regions (QWs) and of the Fabry-Perot distance between reflectors in such vertical cavity devices.

It is an additional object of the invention to ensure that the method of making the vertical optical cavity devices is simple and cost-efficient.

Yet another object of the invention is to ensure that vertical optical cavity devices can be grown monolithically and as arrays of elements.

Further objects and advantages will become apparent upon reading the specification.

SUMMARY

These objects and advantages are attained by a monolithic device with a vertical optical cavity built up along a vertical direction. The device has a bottom Distributed Bragg Reflector (DBR) made up of a number of bottom reflectors or alternating $\lambda/4$ layers. A Quantum Well (QW) region consisting of least one active layer is grown on top of the bottom DBR by using a Selective Area Epitaxy (SAE) mask or growing pattern. To ensure proper SAE growth of the QW the mask is made of a dielectric, a nitride or an oxide. Depending on the SAE conditions, the QW region can have one or more strained QWs. Additionally, the active layer or layers exhibit a variation in at least one physical parameter in a horizontal plane, i.e., in a plane perpendicular to the vertical direction. A top DBR consisting of a number of top reflectors is deposited on top of the QW region. A spacer is also deposited adjacent the QW region, e.g., below and/or above the QW region. The spacer can exhibit a variation in its surface curvature or it can have a varying thickness in the horizontal plane. The spacer is preferably also grown by SAE.

The device of the invention has a Fabry-Perot distance which is defined along the vertical direction between the bottom DBR and the top DBR. This Fabry-Perot distance also varies depending on the position in the horizontal plane. For example, the Fabry-Perot distance varies due to varying thickness of the QW or of the spacer.

The varying physical parameter of the active layers is either their surface curvature and/or the band gap. Both of these parameters are regulated by SAE. The band gap is preferably adjusted by altering the relative concentration of materials or elements of the active layer in accordance with SAE.

The SAE mask in the simplest case includes two stripes separated by a gap in which the QW and the spacer are grown. The mask can also be selected from many shapes such as circular stripes, semi-circular stripes, wedge stripes and elliptical stripes as required. The mask shapes are tailored to control thickness and relative concentration of constituent materials of the active layers as well as polarization of the radiation supported by the optical cavity.

It is also preferable that the active layers have a first index of refraction and a first top reflector adjacent to the active region have a second index of refraction either larger or smaller that the first index of refraction. This difference in indices can be used for lensing, guiding or anti-guiding of electromagnetic radiation within the cavity. For better performance, the active layers should exhibit a predetermined surface curvature.

In a preferred embodiment the QW has a number of active layers and the surface curvature of each active layer is controlled. For example, the curvature of the bottom active layer can exhibit the largest bow and the curvature of the top active layer can have the least bow.

The vertical cavity device according to the invention can be used as a Vertical Cavity Surface Emitting Laser (VCSEL) or a Vertical Cavity Detector (VCDET). In the first case a current supply is provided for inducing the active layers to emit electromagnetic radiation. In the second case a suitable circuit is provided to render an absorbing layer sensitive to incident electromagnetic radiation when absorbed.

The method of the invention permits one to construct vertical optical cavities by appropriately tailoring the SAE conditions. Further details and an explanation of the invention are contained in the detailed specification with reference to the appended drawing figures.

DESCRIPTION OF THE FIGURES

FIG. 9A–C are plan views of SAE masks for active layers with polarization control.

FIG. 10 is a plot of Quantum Well gain position and Fabry-Perot position of a Vertical Cavity Surface Emitting Laser (VCSEL) made with the aid of SAE according to the invention.

DETAILED DESCRIPTION

Figure 1:
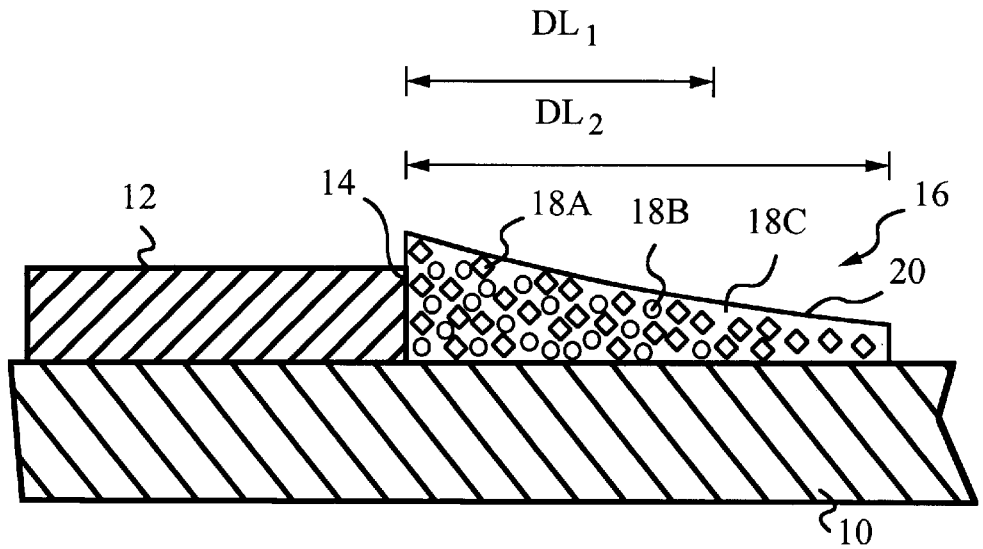
FIG. 1 is a cross sectional view illustrating some fundamental aspects of growth by Selective Area Epitaxy (SAE).

The vertical optical cavity devices of the present invention and the steps required to grow them rely on the use of the known technique of Selective Area Epitaxy (SAE). FIG. 1 illustrates the most relevant aspects of SAE when performing epitaxial growth by metal-organic chemical vapor deposition (MOCVD), molecular beam epitaxy (MBE) or metal organic molecular beam epitaxy (MOMBE) on a substrate 10, e.g., a GaAs substrate.

A growing pattern or an SAE mask 12 with an edge 14 is deposited on top of substrate 10. The material of mask 12 is a dielectric, a nitride, an oxide or any other suitable material which does not support epitaxial growth of a deposited material 16. Thus, rather than growing on mask 12 precursors of material 16, e.g., tri-methyl-Ga, migrates to the surface of substrate 10. Hence, the growth of material 16 on substrate 10 is enhanced, especially near edge 14. This is evidenced by the decreasing thickness of material 16 with increasing distance from edge 14.

In addition to the decreasing thickness of material 16 away from edge 14, individual components 18A, 18B and 18C of material 16, in this case In, Ga and As have different diffusion lengths. For illustration purposes, in FIG. 1 component 18A, or Ga and component 18B, or In are designated by circles and squares. A diffusion length $DL_1$ of Ga is smaller than a diffusion length $DL_2$ of In. Hence, the relative concentrations of Ga and In vary with distance from edge 14.

SAE growth of material 16 also affects a surface 20 of the grown material. In particular, surface 20 has a natural bow or curvature due to SAE. The curvature is generally concave and results from the above-described effects of decreasing epitaxial growth with increasing distance from edge 14 and varying diffusion lengths of components 18A, 18B.

Figure 2:
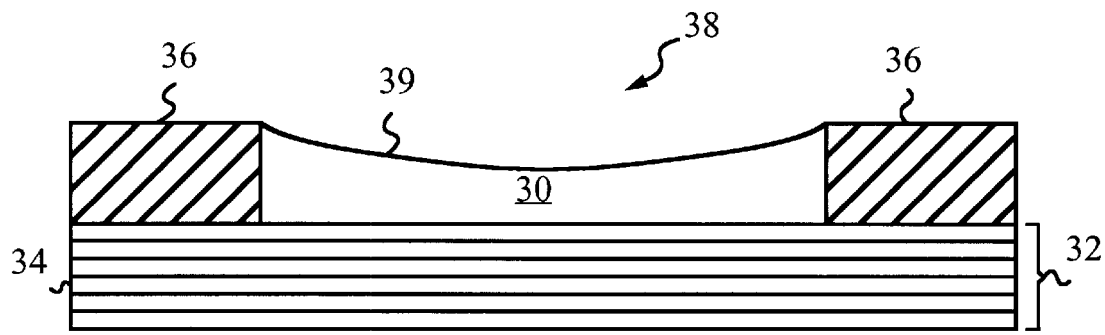
FIG. 2 is a cross sectional view showing an active layer grown by SAE.
Figure 3:
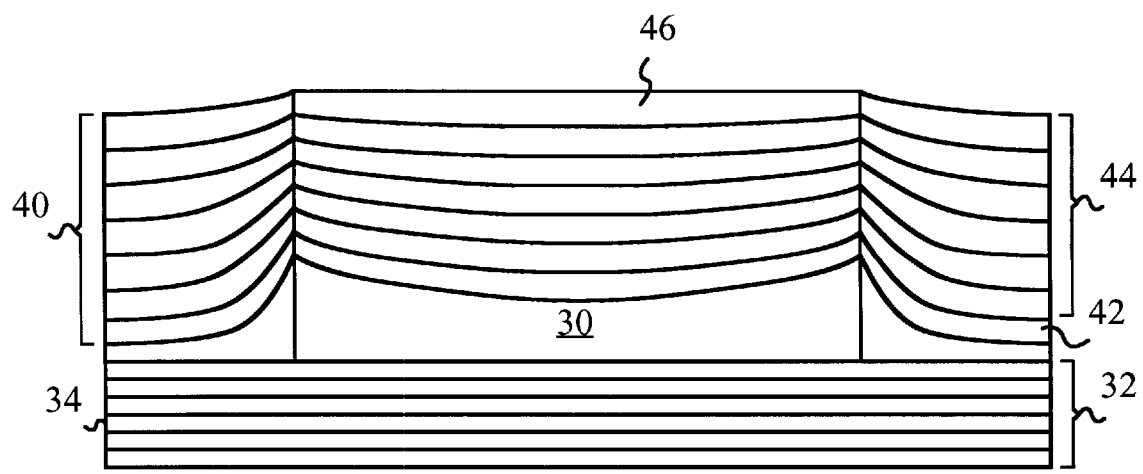
FIG. 3 is a cross sectional view showing a number of active layers and a spacer grown by SAE.

The basics of applying SAE to growing vertical optical cavities are illustrated in FIGS. 2–3. In FIG. 2 an active layer 30 grown by SAE on a bottom Distributed Bragg Reflector 32 consists of alternating reflectors or λ/4 layers 34. A mask 36 has a gap 38 within which active layer 30 is deposited. Active layer 30 has a concave surface 39. FIG. 3 shows the result of removing mask 36 and growing additional layers 40, in this case a spacer 42 and a top DBR 44 consisting of λ/4 layers 46 on top of active layer 30 without SAE. The surface curvature of each successive layer is smaller and the curvature of the topmost layer 46 of top DBR is approximately zero.

Figure 4A:
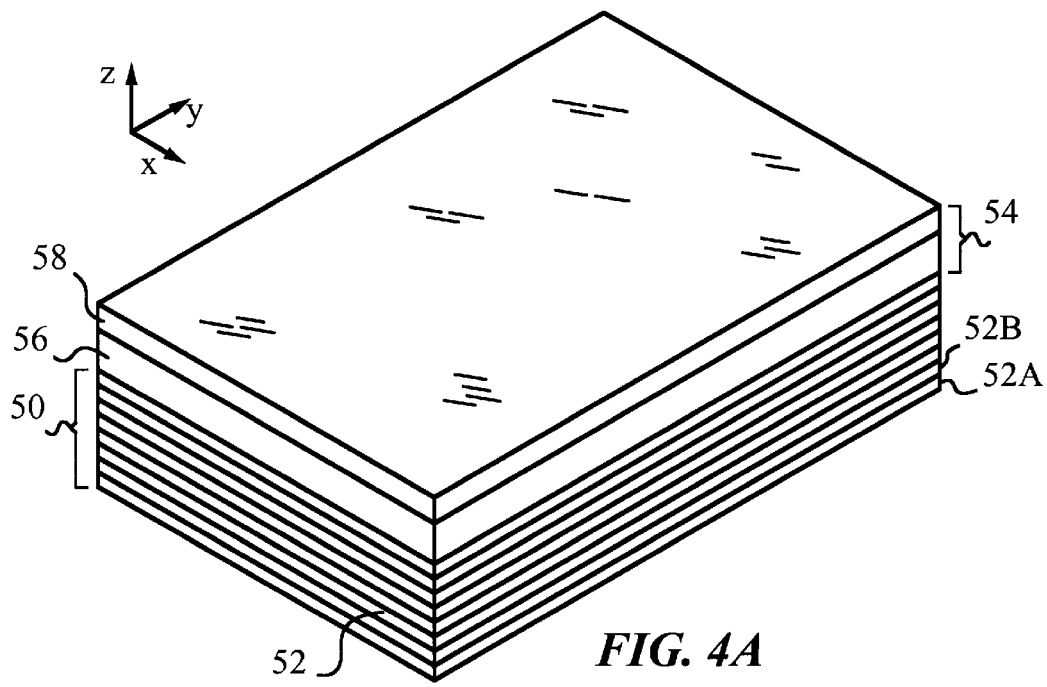
FIG. 4A–F are isometric views illustrating a preferred process of making a vertical optical cavity.
Figure 4B:
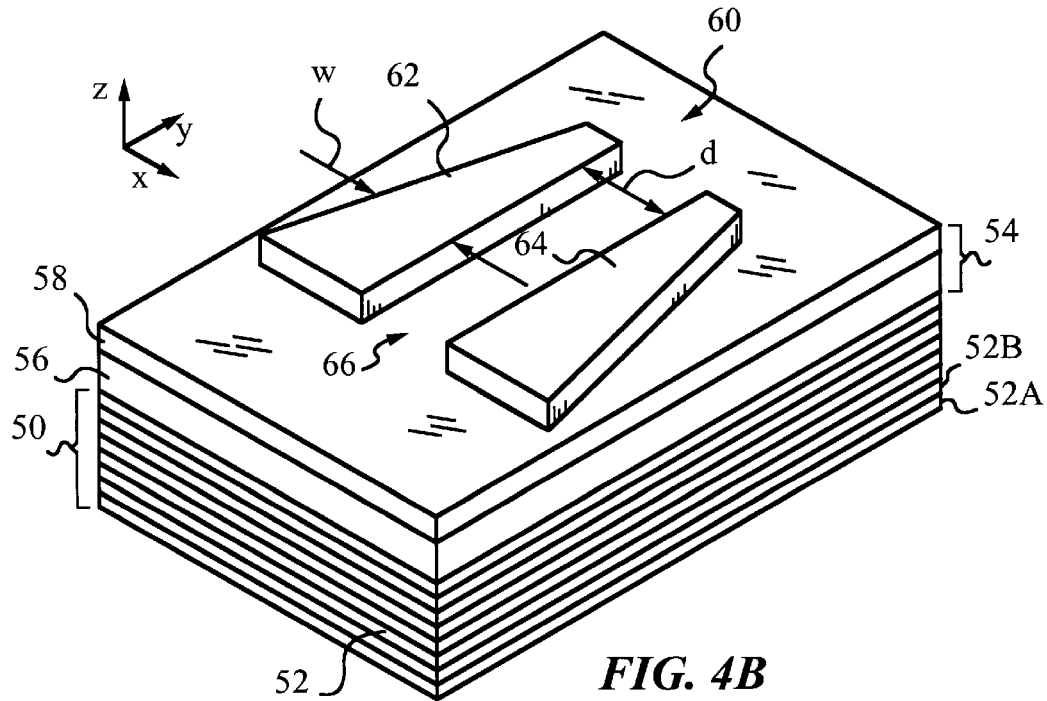
Figure 4C:
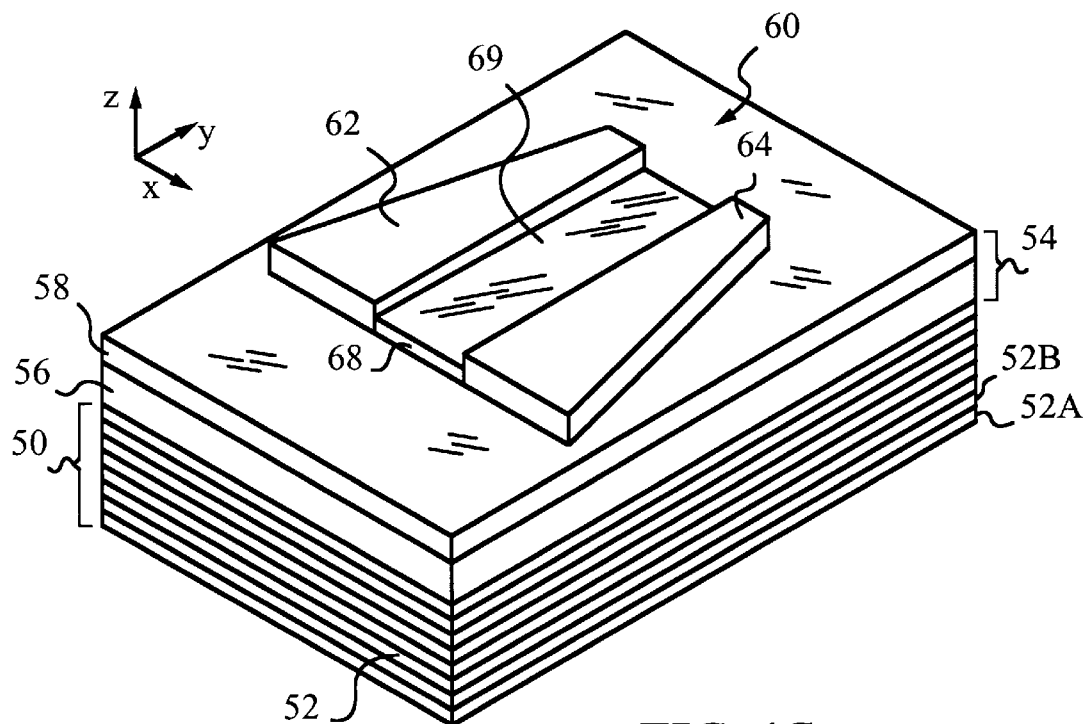
Figure 4D:
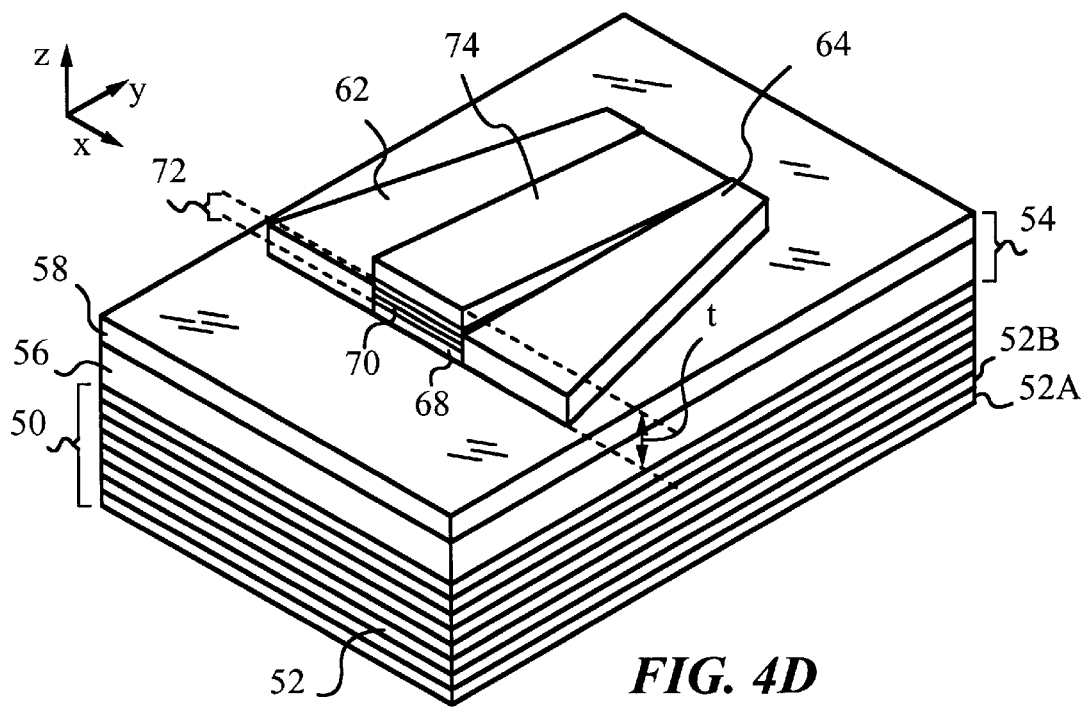
Figure 4E:
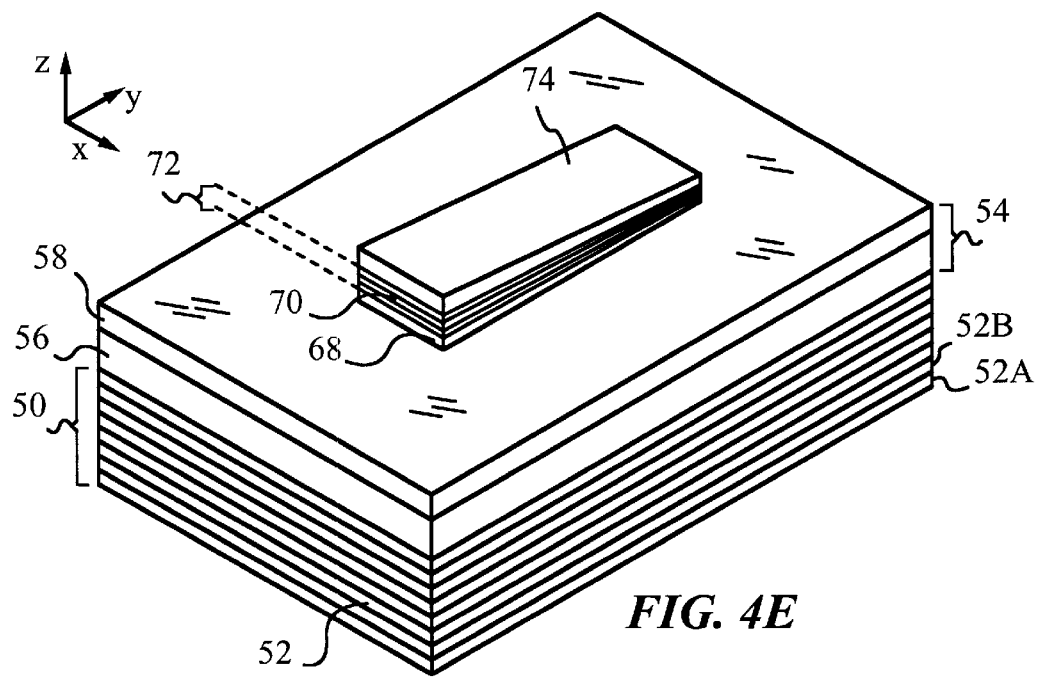
Figure 4F:
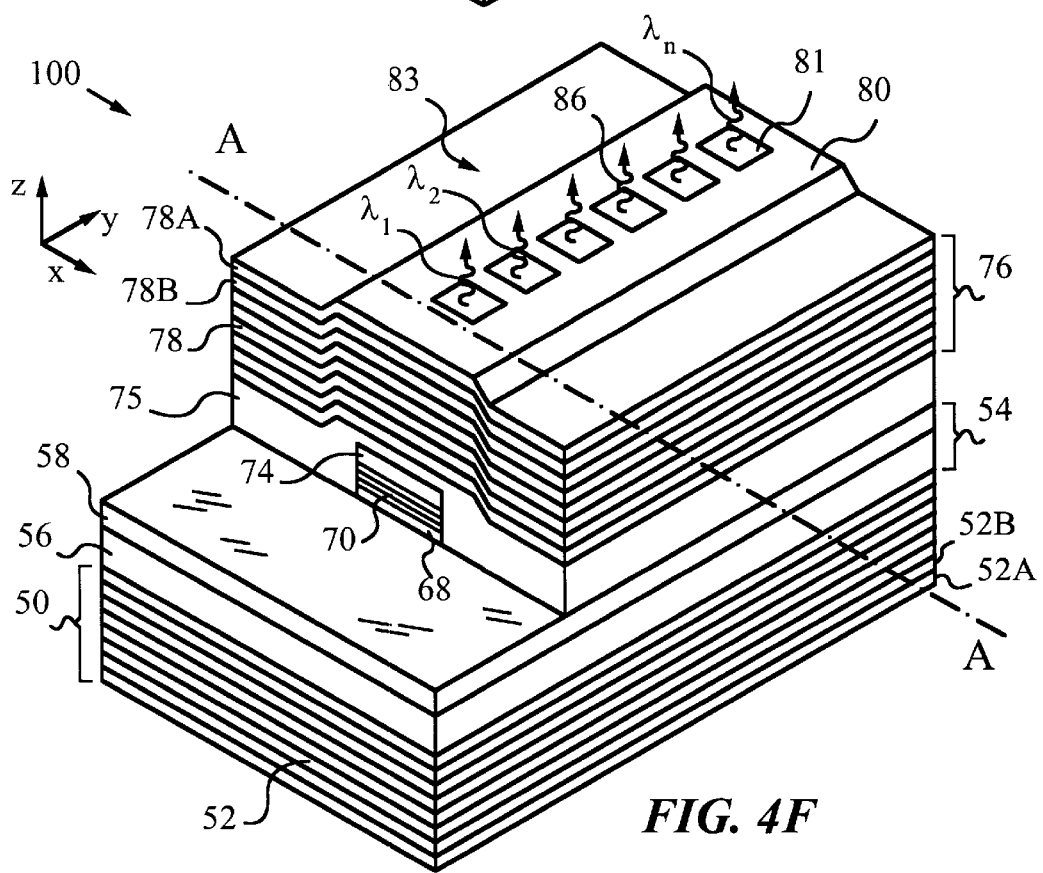

The isometric views of FIGS. 4A–F show how the above-described principles of SAE growth are used to produce a preferred vertical optical cavity device 100 (see FIG. 4F). Device 100 is grown along a vertical direction or the z-direction. First, as shown in FIG. 4A, a bottom DBR 50 consisting of bottom reflectors or λ/4 layers 52 is grown by standard epitaxy techniques such as MOCVD or MBE. Layers 52 are actually layer pairs 52A, 52B, e.g., GaAs/AlAs pairs. The number of GaAs/AlAs layer pairs depends on the desired reflectivity and will be determined by the designer based on well-known principles. For example, if device 100 is to be used as a Vertical Cavity Surface Emitting Laser (VCSEL) the number of GaAs/AlAs layer pairs can range between 30 and 40 or more to ensure sufficiently high reflectivity for DBR 50 to function as a high reflector.

A spacer 54 is also grown on bottom DBR 50. In this case spacer 54 is made up of two layers 56, 58 consisting of, for example, $Al_{0.2}Ga_{0.8}As$ and GaAs. A person of average skill in the art will be able to determine the required thickness and composition of spacer 54.

In the next step the surface of layer 58 is patterned to produce an SAE mask 60. As illustrated in FIG. 4B, mask 60 consists of two stripes 62, 64 with a gap 66 between them. Stripes 62, 64 are made of silicon nitride and their width, w, tapers down along the y-direction. Meanwhile, the width, d, of gap 66 remains constant. After the patterning step the surface of layer 58 and stripes 62, 64 are cleaned for regrowth.

For any mask made up of two stripes the SAE enhancement factor $E_x$ for material x is characterized by the following linear relationship:

$$E_X \propto \frac{w}{d}.$$

Therefore, in the case of mask 60 the Ga and In enhancement factors, $E_{Ga}$ and $E_{In}$, both decrease along the y-direction.

During the next step a layer 68 of GaAs is grown in gap 66 by SAE. The result is shown in FIG. 4C. Layer 68 has a curved surface 69 due to SAE growth conditions explained above and the thickness of layer 68 tapers off along the y-direction because of reduced SAE enhancement.

Subsequently, as shown in FIG. 4D, three Quantum Wells (QWs) or active layers 70 are grown by SAE in gap 66 between stripes 62, 64. Typically, thin interlayers (not shown) are also grown between Qws 70 as required. Active layers 70 with any eventual interlayers make up a Quantum Well (QW) region 72. Active layers 70 are made of an active material or lasing medium. For example, a suitable lasing material is $In_{0.17}Ga_{0.83}As$. Of course, QW region 72 may also be made up of more active layers like layer 70 thus producing a larger stack of QWs or, alternatively, just one active layer 70.

Since the diffusion length of Ga is less than the diffusion length of In the surfaces of active layers 70 are curved and the relative concentrations of In and Ga vary depending on the distance from stripes 62, 64 along the x-direction. Also, the overall thickness of active layers varies in the y-direction because of decreasing SAE enhancement. Thus, two physical parameters, the relative concentration of In and Ga and the thickness of active layers 70 vary in a horizontal plane, specifically the x-y plane.

These two physical parameters influence the local band gap of active layers 70 at all locations in the x-y plane. In other words, the gain position of device 100 is controlled by the thickness and composition of the QW region 72 and specifically of active layers 70. Both of these physical parameters are a function of SAE enhancement as discussed above. Care has to be taken to ensure that the SAE enhancement factor $E_x$ is not too large such that the thickness and composition of active layers 70 and layer 68 do not exceed a critical thickness. Otherwise, the crystal lattice will relax and defects will be generated which will prevent the finished device from functioning. A person of average skill in the art is familiar with this problem and will be able to ensure that the critical thickness is not exceeded.

Active layers 70 are covered by a layer 74 of inert material, e.g., GaAs. Although in FIG. 4D layer 74 is grown with stripes 62 and 64 present and therefore benefits from SAE growth it is also possible to remove stripes 62 and 64 at any point during the growth of layer 74. The remainder of layer 74 can then be grown with the normal MOCVD technique. A total thickness, t, indicates the thickness of growth obtained with the aid of SAE.

The structure remaining after the removal of stripes 62, 64 of mask 60 is shown in FIG. 4E. This removal is performed according to well-known methods, such as a buffered-oxide etch (BOE). The decrease in thickness of inert layer 68 and of active layers 70 of QW region 72 along the y-direction is clearly visible. The natural bow or concave curvature due to SAE growth is present as well, though not explicitly shown in this drawing (see FIG. 2). The curvature translates into thickness variation along the x-axis. In particular, the thickness of active layers 70 is smallest exactly half-way between stripes 62, 64 and increases gradually as one moves closer to stripes 62, 64.

Because of the variation in the thickness of active layers 70 of QW region 72 and change in the relative concentration of In and Ga in active layers 70 the band gap of active layers 70 varies in the x-y plane. The variation along the y-direction is primarily due to the decreasing thickness of layers 70 and variation in Ga and In concentration. The variation along the x-axis is primarily due to the change in surface curvature of layers 70 and also due to the change in relative concentration of In and Ga in layers 68, 70 and 74.

Figure 5:
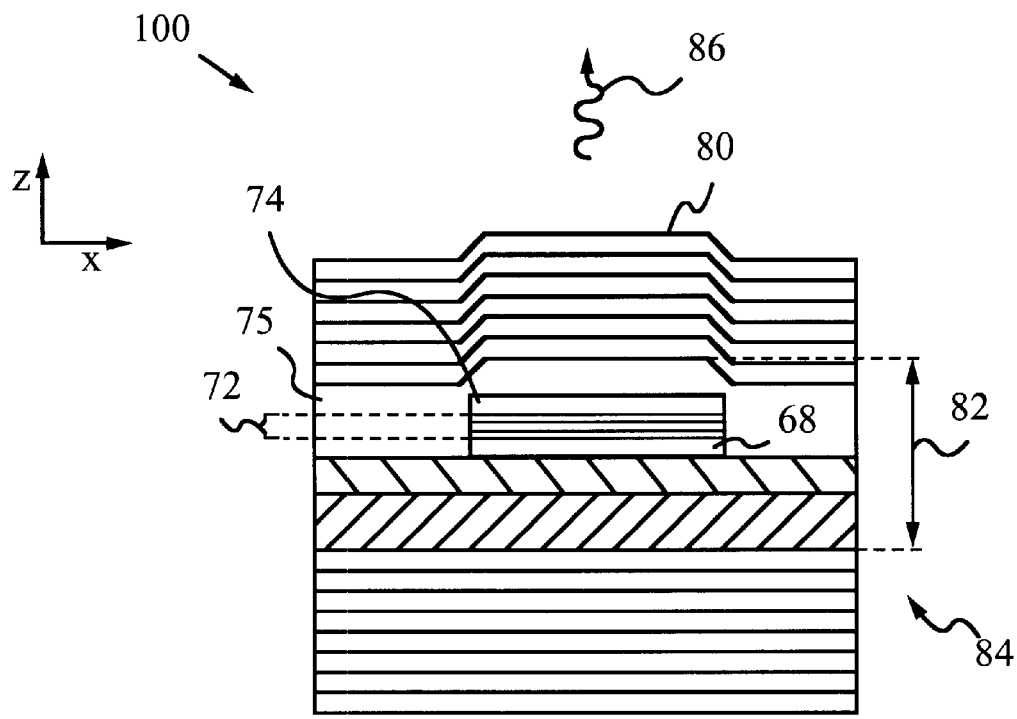
FIG. 5 is a cross sectional view showing the vertical optical cavity made by the preferred process.

The last steps of the method involves growing a top spacer 75, which may consist of two separate layers (not shown), e.g., GaAs and $Al_{0.2}Ga_{0.8}As$, and a top DBR 76, as illustrated in FIGS. 4F and 5. Like bottom DBR 50, top DBR 76 is made up of top reflectors or pairs of layers 78A, 78B. These can be tailored like and have the same composition as layers 52A, 52B. The reflectivity of top DBR 76 is selected based on whether device 100 is to be a VCSEL or a VCDET. In the former case the number of layers 78A, 78B should be smaller than the number of layers 52A, 52B to ensure a lower reflectivity of top DBR 76 such that it can function as an output coupler.

The very final step involves processing a top surface 80 of the topmost layer 78B of top DBR 76 to produce an array 83 of output windows or facets 81 along the y-direction. Because of the decreasing thickness of layer 68, QWs 70 and top spacer 75 a Fabry-Perot distance 82 between bottom DBR 50 and top DBR 76, as defined in the corresponding cross sectional view of FIG. 5, decreases along the y-direction. As is well-known, distance 82 determines the length of a Fabry-Perot type lasing cavity 84 which, in turn, determines what wavelength $\lambda$ of electromagnetic radiation 86 is permitted to oscillate inside cavity 84. Clearly, the wavelength $\lambda$ of radiation 86 permitted by Fabry-Perot distance 82 decreases along the y-direction.

Meanwhile, the gain position of QWs 70 also varies along the y-direction, as described above. In particular, the gain position decreases along the y-direction such that QWs 70 produce gain at the wavelength $\lambda$ dictated by Fabry-Perot distance 82 at each point along the y-direction. Hence, each window 81 of array 83 emits radiation 86 at a different wavelength $\lambda_1, \lambda_2, \ldots \lambda_n$. In this case device 100 is a multiple-wavelength VCSEL. Bottom DBR 50 is the high reflector while top DBR 76 is the output coupler.

Figure 6:
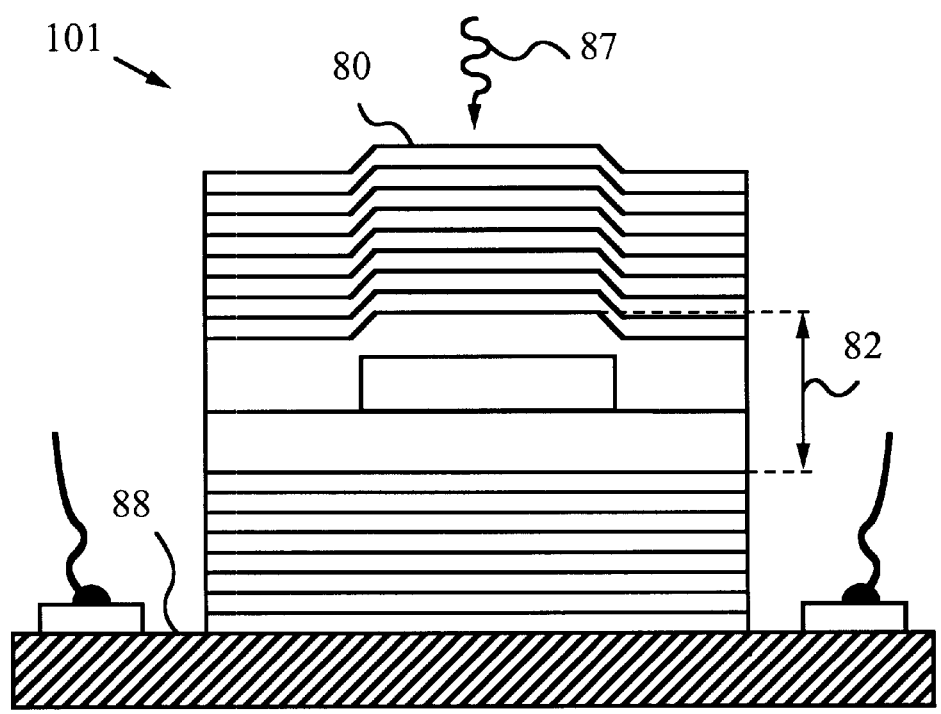
FIG. 6 is a cross sectional view of a vertical optical cavity device used as a Vertical Cavity Detector (VCDET).

FIG. 6 illustrates a device 101 essentially analogous to device 100 designed to function as a multiple wavelength VCDET 101 or an array of VCDETs. The method of making device 101 is also analogous to the method of making device 100. In this case, however, top DBR 76 has approximately the same reflectivity as bottom DBR 50. In addition, a bottom p-i-n absorbing region 88 is provided to absorb incident radiation 87 whose $\lambda$ matches the resonant $\lambda$ determined by Fabry-Perot distance 82. Radiation 87 of a wavelength $\lambda$ to be detected is admitted into VCDET 101 through surface 80. Instead of QW region 72, passive filter layers 71 form a filter spacer which exhibits thickness, curvature and composition variations in the x-y plane due to SAE. A standard detection circuit (not shown) is also provided to detect the electrical pulses generated in layer 88 as radiation 87 is absorbed.

Since Fabry-Perot distance 82 varies in the x-y plane, and specifically along the y-direction, the wavelength $\lambda$ of radiation 87 which can be detected by VCDET 101 also varies along the y-direction. Given that same mask 60 is used for making VCDET 101 as VCSEL 100, then the wavelength $\lambda$ of detectable radiation 87 will decrease along the y-direction. Thus, with a map of $\lambda$ or Fabry-Perot distance 82 as a function of y position VCDET 101 can be used to detect an entire bandwidth of radiation 87. Furthermore, VCDET 101 can have input windows or facets 81 just like VCSEL 100 or have one continuous facet for continuous wavelength detection.

Figure 7:
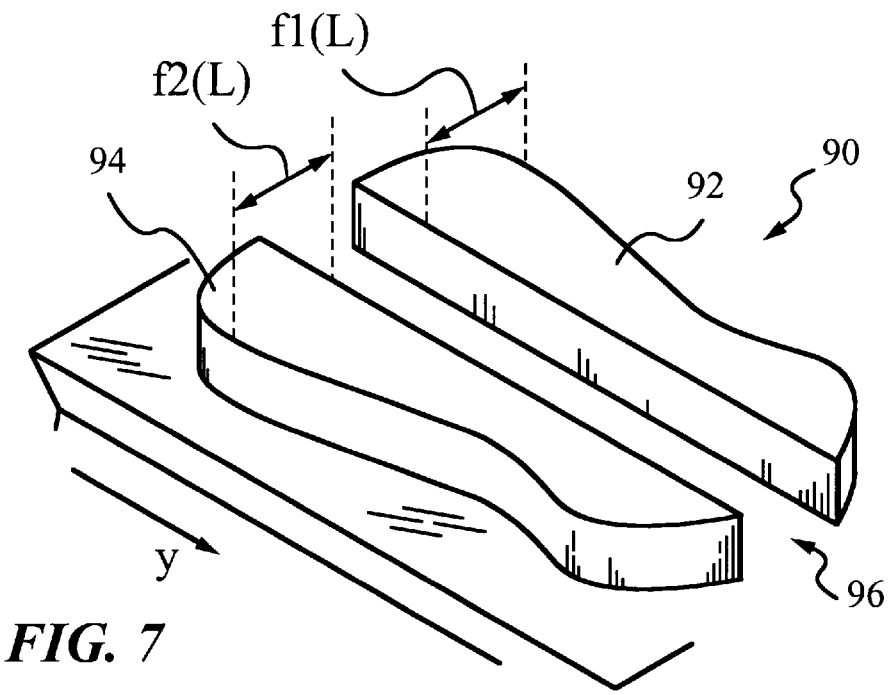
FIG. 7 is an isometric view of a general SAE mask.

From the above description it will be apparent to a person of average skill in the art that SAE mask 60, and particularly the geometry of gap 66 is crucial to tailoring the band gap and Fabry-Perot distance 82. A general mask 90 is shown in FIG. 7. Mask 90 has two stripes 92, 94 defining a gap 96 between them. The width of stripe 92 varies along length L and is represented by a function f1 (L). Analogously, the width of stripe 94 varies with length L and is represented by f2 (L). In the present case the width variations of stripes 92 and 94 are symmetric but they do not have to be. Also, the width of gap 96 is constant, but it can vary. Once again, the width w of stripes 92, 94 and the width d of gap 96 are dictated by the desired SAE enhancement factor $E_x$ according to the relation:

$$E_X \propto \frac{w}{d}.$$

Based on this information, a person familiar with SAE will know how to select the proper functions f1(L) and f2(L) to produce proper growth enhancement in gap 96 to produce active layers with the desired concentration variation along the x- and y-directions in the x-y plane, surface curvature and overall thickness variation.

Figure 8A:
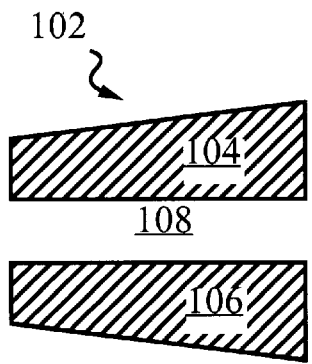
FIG. 8A–E are plan views of particular SAE masks.
Figure 8B:
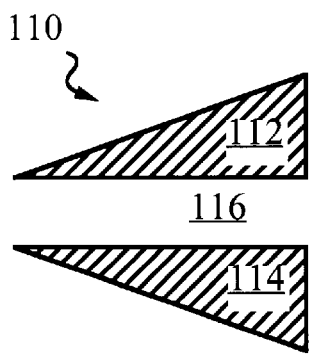
Figure 8C:
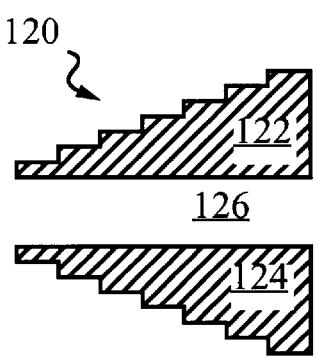
Figure 8D:
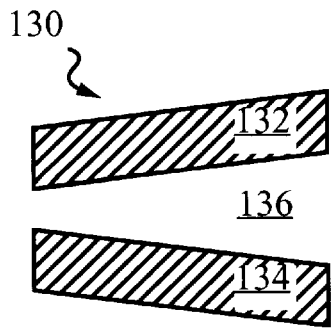

FIGS. 8A–E show some particularly useful mask shapes. For example, a mask 102 shown in FIG. 8A is similar to mask 60 used for making devices 100 and 101. It consists of two stripes 104, 106 defining a constant width gap 108. Stripes 104, 106 widen and enhance SAE growth in gap 108 more at their wide ends than at their narrow ends. FIG. 8B shows a mask 110 consisting of triangular stripes 112 and 114 with a constant width gap 116. Mask 110 enhances SAE growth more at the wide ends of triangles 112 and 114 than at their corners. FIG. 8C illustrates a mask 120 with a gap 126 defined between two step-graded triangular stripes 122 and 124. The SAE growth enhancement factor for mask 120 will be constant at each step and undergo a discontinuous increase towards the wide end of stripes 122 and 124 at each step. A mask 130 of FIG. 8D has two stripes 132, 134 which do not vary in width, but are set aslant to each other such that they define a gap 136 of varying width. Mask 130 is similar to mask 60 discussed above.

Mask 120 is useful for large-scale manufacturing because it is more tolerant to misalignment of output facets in the final device. This is due to the fact that the SAE enhancement varies step-wise and so do the Fabry-Perot distance and QW gain position. On the other hand, the steps of mask 120 have to be very precisely dimensioned. In contrast, masks 102, 110 and 130 exhibit continuous variation in SAE enhancement, Fabry-Perot distance and QW gain position. They thus provide for continuous adjustments in the position of the output facets such that Fabry-Perot distances determining the desired wavelengths $\lambda_1, \lambda_2, \ldots \lambda_n$ are aligned with the desired output facets.

Figure 8E:
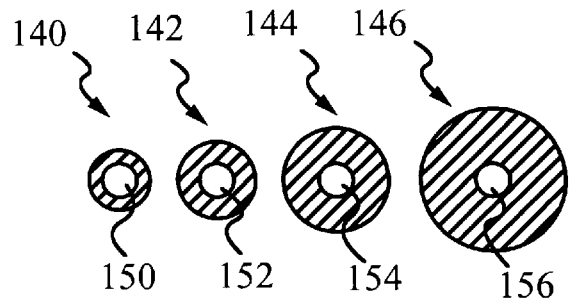

FIG. 8E illustrates four circular masks 140, 142, 144 and 146 which are essentially circular stripes having central openings 150, 152, 154 and 156 corresponding to the gap where SAE growth is enhanced. The widths of masks 140, 142, 144 and 146 vary progressively from thin to thick while central openings 150, 152, 154 and 156 remain the same. Clearly, SAE growth is enhanced least by mask 140 in opening 150 and most by mask 146 in opening 156. To a first approximation, the SAE enhancement factor $E_x$ for circular masks is given by the following relation:

$$E_X \propto \frac{MA}{OA},$$

where MA is the surface area of the mask and OA is the area of the opening.

According to an additional aspect of the invention, the natural curvature due to SAE growth is further used to control the polarization of emitted radiation, e.g., radiation 86 in device 100. This is done by introducing an asymmetry in the SAE grown layers 68, 70 and, as the case may be in layer 74, by using an asymmetric mask. An asymmetric mask produces a strain and/or thickness difference along one crystal orientation of the layers grown by SAE. Suitable asymmetric SAE mask patterns include trapezoids of FIG. 8D and masks 160, 170 and 180 shown in FIGS. 9A–C.

When using any of the above asymmetric masks with InGaAs quantum wells a strain asymmetry will additionally be introduced due to the differential growth rate enhancement of In and Ga as discussed above. Hence, SAE growth in this case will produce differential strain along different directions (e.g., along the major and minor axes of mask 160).

The method of the invention also permits to produce devices with built-in positive and negative lensing and index guiding and anti-guiding. Referring back to FIG. 3, when active layer 30 is made of a material which a larger refractive index than the effective index of layers 40, and especially the adjacent layer 42, then electromagnetic radiation will experience a diverging lens effect due to the curvature of surface 39 and the index difference. Alternatively, when the index of active layer 30 is smaller than that of layers 40, and especially of layer 42, then the radiation will experience a converging lens effect. The lensing effect is especially large when the curvature of surface 39 is significant and the index difference is large. For example, by making layer 30 according to SAE a thickness difference of 4% can be achieved between the center of layer 30 and its edges while producing a viable quantum well.

Additionally, the positive and negative lensing effects cause index guiding and anti-guiding according to well-known principles. Hence, the method of the invention can be used to enhance single-mode operation in the devices it produces in the small index guiding and any index anti-guiding areas.

EXAMPLE

The following example merely serves to illustrate a particular embodiment of the invention and is not intended as a limitation. A practical VCSEL array capable of generating output radiation with λ ranging from 930–980 nm is produced using a mask consisting of two closely spaced trapezoidal strips (see FIG. 8A). First, one grows a bottom DBR consisting of 35 pairs of GaAs/AlAs distributed Bragg reflectors and 52 nm of $Al_{0.2}Ga_{0.8}As$ and 24.8 nm of GaAs with MOCVD or MBE in an appropriate chamber.

The wafer is then patterned with 100 nm silicon nitride to produce the SAE mask as shown in FIG. 8B. The width w of the mask varies from 0 to 100 $\mu$m and it is 1,000 Angstroms thick. The wafer is cleaned for regrowth using HCl and reloaded into the chamber. During the SAE growth one produces a 26.5 nm layer of GaAs covered by three 4.2 nm $In_{0.17}Ga_{0.83}As$ quantum wells with 10 nm separation or intermediate layers and another 26.5 nm thick layer of GaAs.

At this point the wafer is removed from the chamber and the silicon nitride is removed with BOE. The wafer is then again re-loaded into the chamber to re-grow 24.8 nm of GaAs without SAE enhancement, 52 nm of $Al_{0.2}Ga_{0.8}As$ and 26 pairs of $GaAs/Al_{0.7}Ga_{0.3}As$ DBR. The total thickness t of material grown with SAE is preferably t=855 nm.

During the final step the VCSEL array is fabricated along the center line of the SAE mask. The finished device is similar to device 100 shown in FIG. 4F.

The performance of the finished VCSEL array is characterized by the plot in FIG. 10 which graphs the QW gain position and the Fabry-Perot position as a function of width (w) of the SAE strips. The plot includes data point for the VCSEL grown as described with the preferred SAE growth thickness t=85.5 nm and two other thicknesses—t=65.3 nm and t=112.7 nm—for comparison purposes. With the preferred thickness the Fabry-Perot distances are matched with the gain position and thus proper functioning of the VCSEL array is guaranteed.

It will be clear to one skilled in the art that the above embodiment may be altered in many ways without departing from the scope of the invention. For example, the method of the invention can be used with InGaP, InGaAs, InGaAsP and AlGaAs material systems to produce devices according to the invention. It should be noted that growing device according to the invention with with AlGaAs the QWs will automatically be pre-strained.

In view of the above, the scope of the invention should be determined by the following claims and their legal equivalents.

What is claimed is:

1. A monolithic vertical optical cavity extending along a vertical direction and comprising:
    a) a bottom Distributed Bragg Reflector having a plurality of bottom reflectors;
    b) a Quantum Well region grown on top of said bottom Distributed Bragg Reflector using a Selective Area Epitaxy mask, said Quantum Well region comprising at least one active layer having at least one physical parameter exhibiting a variation in a horizontal plane;
    c) a top Distributed Bragg Reflector deposited on top of said Quantum Well region and having a plurality of top reflectors;
where a Fabry-Perot distance defined along said vertical direction between said bottom Distributed Bragg Reflector and said top Distributed Bragg Reflector varies in said horizontal plane.

2. The monolithic vertical optical cavity of claim 1 wherein said at least one physical parameter is selected from parameter consisting of surface curvature of said at least one active layer and band gap of said at least one active layer.

3. The monolithic vertical optical cavity of claim 1 wherein said Selective Area Epitaxy mask comprises two stripes.

4. The monolithic vertical optical cavity of claim 1 wherein said Selective Area Epitaxy mask comprises shapes selected from the group consisting of circular stripes, semicircular stripes, wedge stripes and elliptical stripes.

5. The monolithic vertical optical cavity of claim 1 wherein said Selective Area Epitaxy mask comprises a material selected from the group consisting of dielectrics, nitrides and oxides.

6. The monolithic vertical optical cavity of claim 1 wherein said active layer has a first index of refraction and a first top reflector adjacent said active region has a second index of refraction larger than said first index of refraction.

7. The monolithic vertical optical cavity of claim 6 wherein said at least one physical parameter comprises a surface curvature of said active layer.

8. The monolithic vertical optical cavity of claim 1 wherein said active region has a first index of refraction and a first top reflector adjacent said active layer has a second index of refraction smaller than said first index of refraction.

9. The monolithic vertical optical cavity of claim 8 wherein said at least one physical parameter comprises a surface curvature of said active layer.

10. The monolithic vertical optical cavity of claim 1 wherein said Quantum Well region has a varying thickness in said horizontal plane such that said Fabry-Perot distance varies in said horizontal plane.

11. The monolithic vertical optical cavity of claim 1 further comprising a spacer deposited adjacent said at least one active region.

12. The monolithic vertical optical cavity of claim 11 wherein said spacer has a varying thickness in said horizontal plane.

13. The monolithic vertical optical cavity of claim 11 wherein said spacer has a varying curvature.

14. The monolithic vertical optical cavity of claim 11 wherein at least a portion of said spacer is grown using said Selective Area Epitaxy mask.

15. The monolithic vertical optical cavity of claim 1 wherein said at least one physical parameter is a band gap of said active layer and said variation is a variation in relative concentration of components comprising said at least one active layer.

16. The monolithic vertical optical cavity of claim 1 wherein said Quantum Well region is a strained Quantum Well region.

17. The monolithic vertical optical cavity of claim 1 wherein said at least one active layer comprises a number n of active layers.

18. The monolithic vertical optical cavity of claim 17 wherein said at least one physical parameter is a surface curvature of each of said n active layers.

19. The monolithic vertical optical cavity of claim 18 wherein said surface curvature is different in each of said n active layers.

20. A method of making a monolithic vertical optical cavity extending along a vertical direction comprising the following steps:
    a) depositing a plurality of bottom reflectors to produce a bottom Distributed Bragg Reflector;
    b) producing a Selective Area Epitaxy mask on top of said bottom Distributed Bragg Reflector;
    c) using said Selective Area Epitaxy mask for growing a Quantum Well region on top of said bottom Distributed Bragg Reflector, said Quantum Well comprising at least one active layer having at least one physical parameter exhibiting a variation in a horizontal plane;
    d) depositing a plurality of top reflectors to produce a top Distributed Bragg Reflector, whereby a Fabry-Perot distance is defined along said vertical direction between said bottom Distributed Bragg Reflector and said top Distributed Bragg Reflector and said Fabry-Perot distance varies in said horizontal plane.

21. The method of claim 20 wherein said at least one physical parameter is a surface curvature of said at least one active layer and said method further comprises the step of determining said surface curvature.

22. The method of claim 21 wherein the step of determining said curvature is performed by varying said Selective Area Epitaxy mask.

23. The method of claim 20 wherein said at least one physical parameter is a band gap of said at least one active layer and said method further comprises the step of altering said band gap.

24. The method of claim 23 wherein said step of altering said band gap is performed by altering a relative concentration of components comprising said at least one active layer.

25. The method of claim 20 further comprising the step of growing a spacer adjacent said Quantum Well region.

* * * * *